(12) United States Patent
Gorman et al.

(10) Patent No.: US 8,467,260 B2
(45) Date of Patent: Jun. 18, 2013

(54) STRUCTURE AND METHOD FOR STORING MULTIPLE REPAIR PASS DATA INTO A FUSEBAY

(75) Inventors: Kevin W. Gorman, Cambridge, VT (US); Michael R. Ouellette, Westford, VT (US); Michael A. Ziegerhofer, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 13/198,894

(22) Filed: Aug. 5, 2011

(65) Prior Publication Data

US 2013/0033951 A1    Feb. 7, 2013

(51) Int. Cl.
*G11C 17/16*    (2006.01)

(52) U.S. Cl.
USPC .................................. 365/225.7; 365/189.2

(58) Field of Classification Search
USPC ........................................... 365/225.7, 189.2
See application file for complete search history.

(56) References Cited

U.S. PATENT DOCUMENTS

| | | | |
|---|---|---|---|
| 5,111,457 A | 5/1992 | Rabjohns et al. |
| 5,610,534 A | 3/1997 | Galbraith et al. |
| 5,732,202 A | 3/1998 | Okamoto |
| 6,038,179 A | 3/2000 | Eustis et al. |
| 6,333,878 B2 | 12/2001 | Ooishi |
| 6,367,042 B1 | 4/2002 | Phan et al. |
| 6,434,066 B1 | 8/2002 | Waller et al. |
| 6,577,156 B2 | 6/2003 | Anand et al. |
| 6,651,202 B1 | 11/2003 | Phan |
| 6,757,204 B2 | 6/2004 | Di Ronza et al. |
| 6,766,468 B2 | 7/2004 | Barth, Jr. et al. |
| 6,768,694 B2 | 7/2004 | Anand et al. |
| 6,856,569 B2 | 2/2005 | Nelson et al. |
| 6,898,143 B2 | 5/2005 | Puri et al. |
| 6,922,649 B2 | 7/2005 | Mondal et al. |
| 6,961,890 B2 | 11/2005 | Smith |
| 7,035,158 B2 | 4/2006 | Kozuka |
| 7,043,672 B2 | 5/2006 | Merritt |
| 7,085,182 B2 | 8/2006 | Collura et al. |
| 7,089,136 B2 | 8/2006 | Anand et al. |
| 7,162,669 B2 | 1/2007 | Gross |
| 7,174,486 B2 | 2/2007 | Adams et al. |
| 7,218,561 B2 | 5/2007 | Cowles et al. |
| 7,237,154 B1 | 6/2007 | Zorian |
| 7,251,756 B2 | 7/2007 | Anand et al. |
| 7,269,765 B1 | 9/2007 | Charlton et al. |
| 7,286,419 B2 | 10/2007 | Doi |
| 7,289,382 B2 | 10/2007 | Mozdzen |

(Continued)

OTHER PUBLICATIONS

Agarwal et al., "An Approximation to the Greedy Algorithm for Differential Compression", Jan. 2006, pp. 149-166, IBM J. Res. & Dev., vol. 50, No. 1.

*Primary Examiner* — Michael Tran
(74) *Attorney, Agent, or Firm* — Hoffman Warnick LLC; David A. Cain

(57) ABSTRACT

Fuse macros of identical number of pages are serially arranged to form the same number of fusebay pages each having a length equal to the sum of the respective fuse macro page lengths. Each fuse macro has an enable latch configured to allow activation of one fuse macro at a time. A fusebay control device connected to a repair register may store data in and retrieve data from the fusebay. Next available fuse location is determined in programming mode so that data from a next repair pass may start where the last data ended.

20 Claims, 8 Drawing Sheets

U.S. PATENT DOCUMENTS

| | | |
|---|---|---|
| 7,359,243 B2 | 4/2008 | Ha |
| 7,359,261 B1 | 4/2008 | Wu et al. |
| 7,373,573 B2 | 5/2008 | Riley |
| 7,379,357 B2 | 5/2008 | Kang |
| 7,406,620 B2 | 7/2008 | Shubat et al. |
| 7,415,640 B1 | 8/2008 | Zorian et al. |
| 7,432,755 B1 | 10/2008 | Park et al. |
| 7,477,565 B2 | 1/2009 | Nam et al. |
| 7,493,541 B1 | 2/2009 | Agrawal et al. |
| 7,512,838 B2 | 3/2009 | Rector et al. |
| 7,538,410 B2 | 5/2009 | Yang |
| 7,627,792 B2 | 12/2009 | Di Ronza et al. |
| 7,698,608 B2 | 4/2010 | Riley |
| 7,704,805 B1 | 4/2010 | Cheng et al. |
| 7,757,135 B2 | 7/2010 | Nadeau-Dostie et al. |
| 7,774,660 B2 | 8/2010 | Hsu et al. |
| 7,818,490 B2 | 10/2010 | Conley |
| 7,839,707 B2 | 11/2010 | Aakjer |
| 7,895,028 B2 | 2/2011 | Anand et al. |
| 2008/0266956 A1* | 10/2008 | Byeon et al. ............ 365/185.09 |
| 2009/0016129 A1 | 1/2009 | Anand et al. |
| 2009/0190422 A1 | 7/2009 | Khoja et al. |
| 2009/0285024 A1* | 11/2009 | Kang ...................... 365/185.03 |
| 2010/0284222 A1* | 11/2010 | Jang ...................... 365/185.09 |
| 2012/0155184 A1* | 6/2012 | Kang ...................... 365/185.19 |

* cited by examiner

STRUCTURE AND METHOD FOR STORING MULTIPLE REPAIR PASS DATA INTO A FUSEBAY

BACKGROUND

The present invention relates to semiconductor devices and, more specifically, to a fusebay arrangement allowing one fusebay to store compressed repair data from multiple passes.

In semiconductor chip manufacture, self-testing and self-repair systems are often included in a chip design. An example of such a system 100 is illustrated in FIG. 1. Repair data for a chip is stored in a fusebay bank 110, typically including primary, secondary, and tertiary fusebays 112, 114, 116, in which arrays of one-time-programmable (OTP) elements or fuses are used to represent the data. A "blown" fuse represents a one, while an intact fuse represents a zero. The repair data in the fusebay bank 110 is typically compressed. Upon startup or power-up of the chip, a repair device 120 loads repair data from the fusebays 112, 114, 116 into corresponding decompressors 122, 124, 126. Data from primary and secondary decompressors 122, 124 is sent to XOR comparator 130, the output of which is sent to XOR comparator 132 for comparison to data from tertiary decompressor 126. The output of XOR comparator 132 is sent to a repair register 140. When repair register 140 is full, the repair data is sent to a destination device 141, such as a controller for the device into which the self-test and self-repair system 100 is incorporated.

The approach shown in FIG. 1 benefits from the parallel arrangement of fusebays 112, 114, 116 by being able to decompress and compare data from all fusebays simultaneously. The parallel arrangement thus has a time savings for execution/decompression. However, the parallel arrangement yields fusebays whose sizes are fixed upon construction, so that if a repair pass yields more data to store than allocated in its respective fusebay, there is not enough room for the entire repair pass. Additionally, the control structure for the parallel arrangement requires at least one latch for every fuse in a fusebay, often two per fuse. Thus, for a 64×64 fuse array, there may be as many as 8192 latches required to use the array. This complicates controls for the fusebay and increases time required to blow and read fuses.

SUMMARY

According to one embodiment of the present invention, a fusebay structure may include a first fuse macro with a first data register, a first enable latch, and a first array of fuses. The first array of fuses may be arranged in a first predefined number of fuse macro pages, each of the first fuse macro pages having a first fuse macro page length. The fusebay may also include a second fuse macro with a second data register, a second enable latch, and a second array of fuses. The second array of fuses may be arranged in the first predefined number of fuse macro pages, each of the second fuse macro pages having a second fuse macro page length. The second data register may be connected serially with the first data register, and the second enable latch may be connected serially with the first enable latch. A number of fusebay pages may be equal to the first predefined number of fuse macro pages, and a fusebay page length may equal a sum of the fuse macro page lengths. A fuse location may be determined with a fusebay page number and a position along a respective fusebay page length.

In another embodiment, a fusebay system may have a first fuse macro including a first enable latch, a first data register, and a first array of fuses. The first array of fuses may be arranged in a first predefined number of pages each having a first fuse macro page length. A fusebay control device may be configured to communicate with the first fuse macro employing the first predefined number of pages as a number of fusebay pages and the first fuse macro page lengths as a fusebay page length. A first repair register of a first register length may be connected to the fusebay control device and configured to receive data from, and send data to, the fusebay control device. The fusebay control device may also be configured to issue a fuseblow command to the fusebay when the first repair register is full, the fuseblow command including an address of a fuse to be blown. The address may indicate a fuse location using a respective fusebay page number and a respective position along the respective fusebay page length.

Another embodiment of the invention described herein may include a method of storing data in a fusebay structure of a fusebay system, the fusebay including at least two fuse macros having an identical number of pages. Each fuse macro may have a respective fuse macro page length, a respective data register, a respective enable latch, and a respective fuse array. A fusebay page length may be a sum of the fuse macro page lengths, and a number of fusebay pages may be the number of fuse macro pages. The fusebay system may include a fusebay control device connected to the fusebay and to a repair register. The fusebay control device may execute the method to put the device in one of a test/programming mode or a reading mode. In test/programming mode, a next pass may be started and a pass counter may be advanced, the next pass becoming a current pass. A next available fuse location may be determined and data to be stored may be received. The received data may be stored beginning with the next available fuse, and it may be determined whether the current pass was the last pass. If the current pass is the last pass, an indication of one of the next available fuse or the last used fuse may be stored. If the current pass is not the last pass, the starting of a next pass, the determining of a next available fuse location, the receiving of data to be stored, the storing of the received data, and the determining whether the current pass is a last pass may be repeated. In a reading mode, data may be retrieved from a fusebay and a pass counter may be advanced. The retrieved data may be sent to a repair register, and it may be checked whether a next available fuse has been reached. If the next available fuse has been reached, the method may stop. If the next available fuse has not been reached, the retrieving of data, the sending of the retrieved data, and the checking whether a next available fuse has been reached may be repeated.

An additional embodiment of the invention disclosed herein may include a design structure embodied in a machine readable medium for designing, manufacturing, or testing a design, the design structure including a first fuse macro with a first data register, a first enable latch, and a first array of fuses. The first array of fuses may be arranged in a first predefined number of pages each having a first fuse macro page length. The design may further include at least a second fuse macro each including a respective data register, a respective enable latch, and a respective array of fuses arranged in the first predefined number of pages and a respective fuse macro page length. Each respective data register may be connected serially, and each enable latch may be serially connected. A number of fusebay pages may be equal to the first predefined number of pages, and a fusebay page length may be equal to a sum of the fuse macro page lengths. A fuse location may be determined with a fusebay page number and a position along a respective fusebay page length.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

According to embodiments of the invention disclosed herein, a modular fusebay may employ one or more adjacent, serially connected fuse macros, preferably of substantially identical configuration. Each fuse macro has a respective number of pages of a fuse macro page length. The fuse macro pages may combine to form an aggregate fusebay page, each fusebay page having a page length equal to the number of fuse macros times the fuse macro page length. A fusebay control device, FUSECNTL, may send/receive data from/to a repair register to/from the fusebay. Multiple FUSECNTLs may be included, such that each FUSECNTL is associated with it's own fusebay, for example, when the amount of data is too high for one FUSECNTL to efficiently handle.

Figure 1:
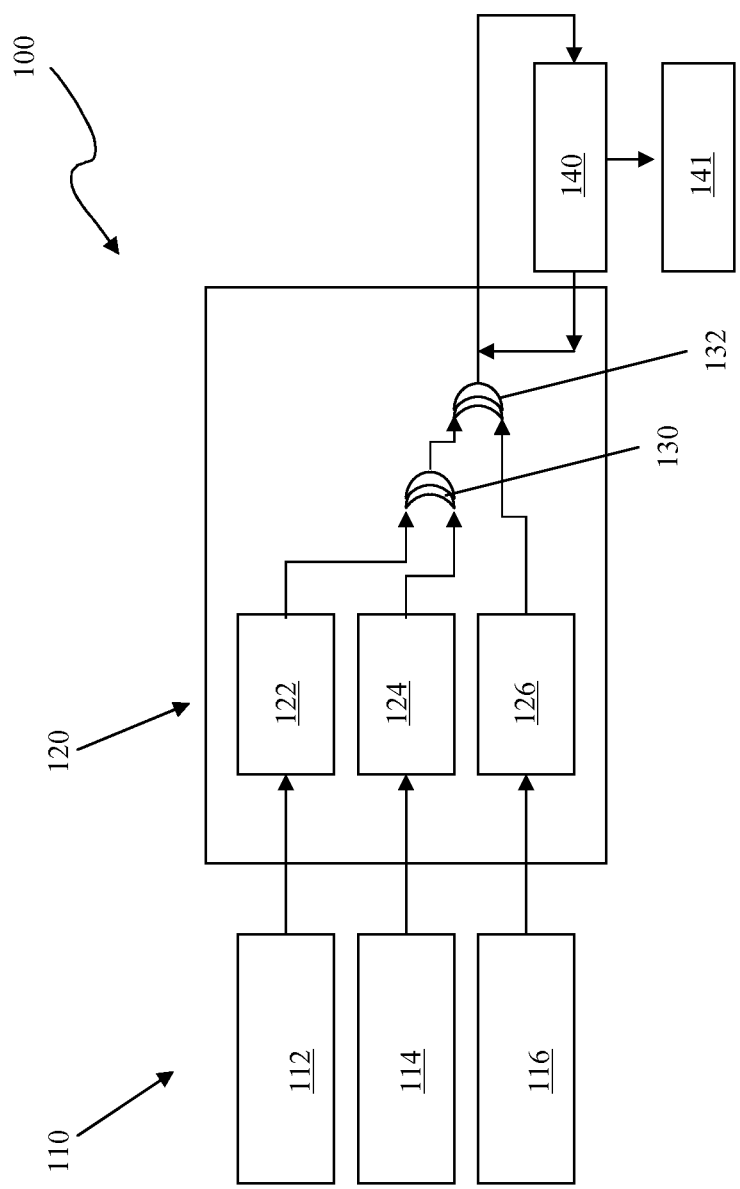
FIG. 1 is a schematic diagram of a prior art fusebay system.
Figure 2:
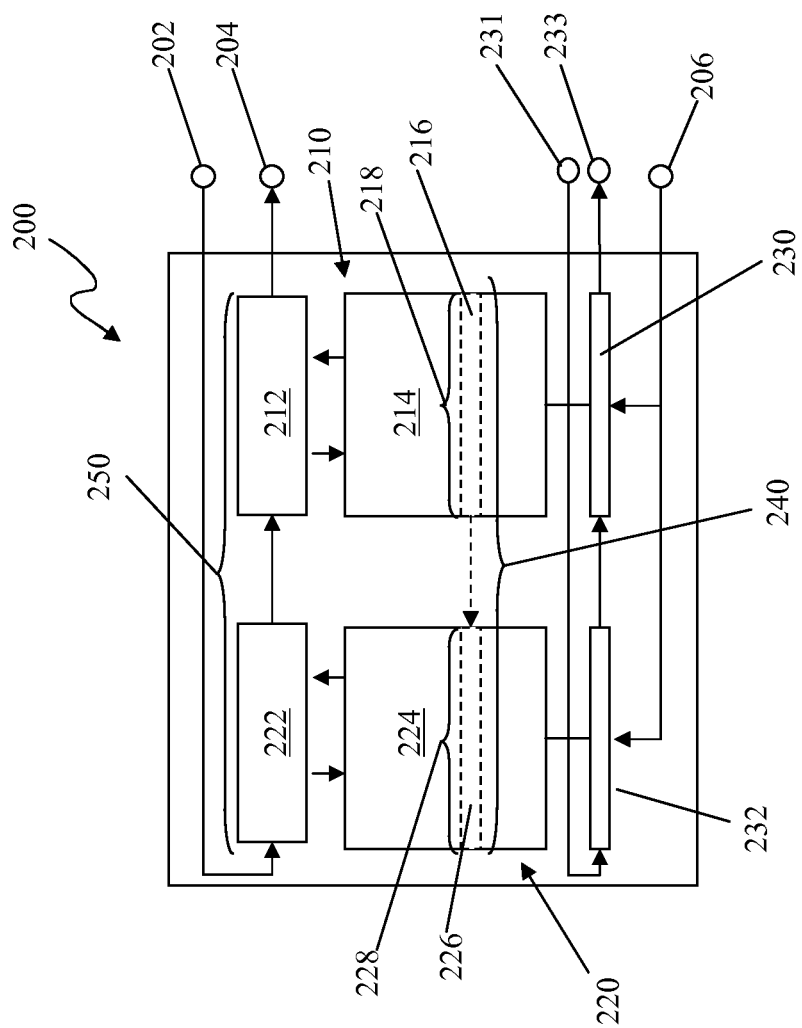
FIG. 2 is a schematic diagram of a fusebay according to an embodiment of the invention disclosed herein.

As seen in FIG. 2, embodiments of the invention disclosed herein may include a fusebay 200 with a first fuse macro 210 having a corresponding first data register 212, a first array of fuses 214, and a first enable latch 230. In addition, fusebay 200 may include a second fuse macro 220 with a corresponding second data register 222, a second array of fuses 224, and a second enable latch 232. In embodiments, each fuse array 214, 224 may be arranged in a respective predefined number of fuse macro pages 216, 226 each of a respective predefined fuse macro page length 218, 228. First fuse macro 210 and second fuse macro 220 may be serially arranged so that the fuse macro pages 214, 224 become page segments of a fusebay page 240 with a length equal to the sum of the fuse macro page lengths. Similarly, the first data register 212 and the second data register 222 together may form a fusebay data register 250 whose length is the sum of the fuse macro data register lengths. A data register input 202 may be connected to one end of fusebay data register 250, while a data register output 204 may be connected to the opposite end of fusebay data register 250. First enable latch 230 and second enable latch 232 may be arranged serially, in embodiments, with an enable input 231 connected to one end of the series and an enable output 233 connected to an opposite end of the series. However arranged, first enable latch 230 and second enable latch 232 allow one fuse macro 210, 220 to be enabled while the other remains inactive. In embodiments, a control node 206 may also be included to send control signals to fuse macros 210, 220. For example, control signals may be simultaneously sent to both fuse macros 210, 220, but through first and second enable latches 230, 232, only a fuse macro 210, 220 with an activated respective enable latch 230, 232 will respond to the control signals.

The example shown in FIG. 2 thus provides a modular fusebay 200 in which data may be stored by loading the data into fusebay data register 250 and issuing a blow command. The blow command may use enable latches 230, 232 and an address within a respective fuse array 214, 224 to blow a fuse for each bit in fusebay data register 250 with a one value. In this fashion, the number of latches required to store data in a fusebay of a given capacity is greatly reduced over prior art arrangements, realizing decreased complexity and time involved in fusebay control. Further, while the example shown in FIG. 2 employs two fuse macros 210, 220, as many fuse macros may be employed as desired, as shown in FIG. 3.

Figure 3:
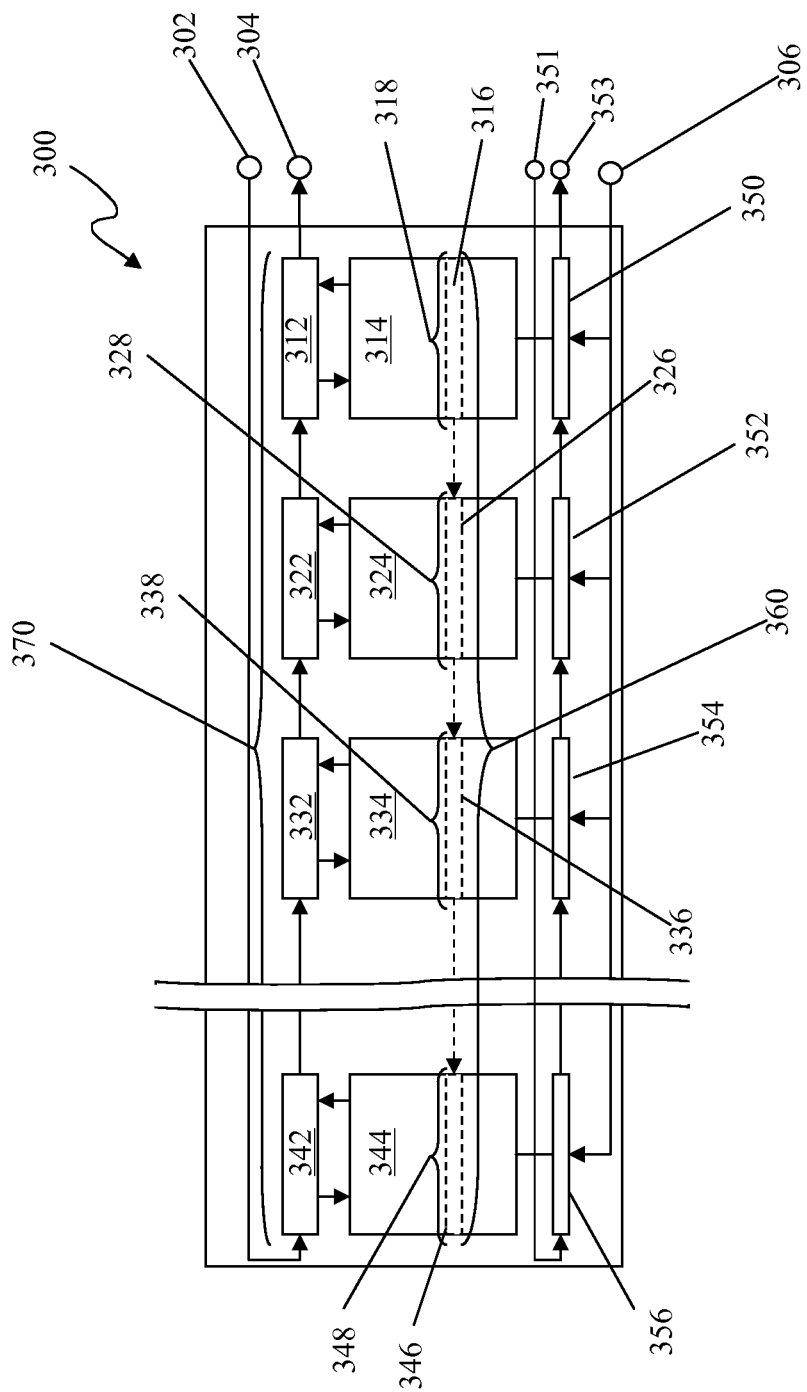
FIG. 3 is a schematic diagram of an expanded fusebay based on that of FIG. 2 according to an embodiment of the invention disclosed herein.

With reference to FIG. 3, a fusebay 300 includes first, second, third, and up to a desired number, such as might be represented by "n," of fuse macros 310, 320, 330, 340. Each fuse macro 310-340 may be of substantially identical size and configuration and serially arranged, as in the example of FIG. 2. Thus, each fuse macro 310-340 may include a respective data register 312, 322, 332, 342, a respective fuse array 314, 324, 334, 344, and a respective enable latch 350, 352, 354, 356. The fuse macro pages 316, 326, 336, 346 together form a fusebay page 360 whose length is the sum of the fuse macro page lengths 318, 328, 338, 348. Data registers 312, 322, 332, 342 may be serially connected to form a fusebay data register 370. Like the example shown in FIG. 2, fusebay 300 may include an input 302 and an output 304 connected to opposite ends of fusebay data register 370. Also as with the example shown in FIG. 2, enable latches 350, 352, 354, 356 may be serially connected, with an enable input 351 on one end of the series and an enable output 353 on an opposite end of the series. A control node 306 may also be included to allow control signals to be sent to fuse arrays 314, 324, 334, 344 simultaneously. In embodiments, only a fuse array 314, 324, 334, 344 with an activated respective enable latch will respond to any control signals sent via control node 306.

Figure 4:
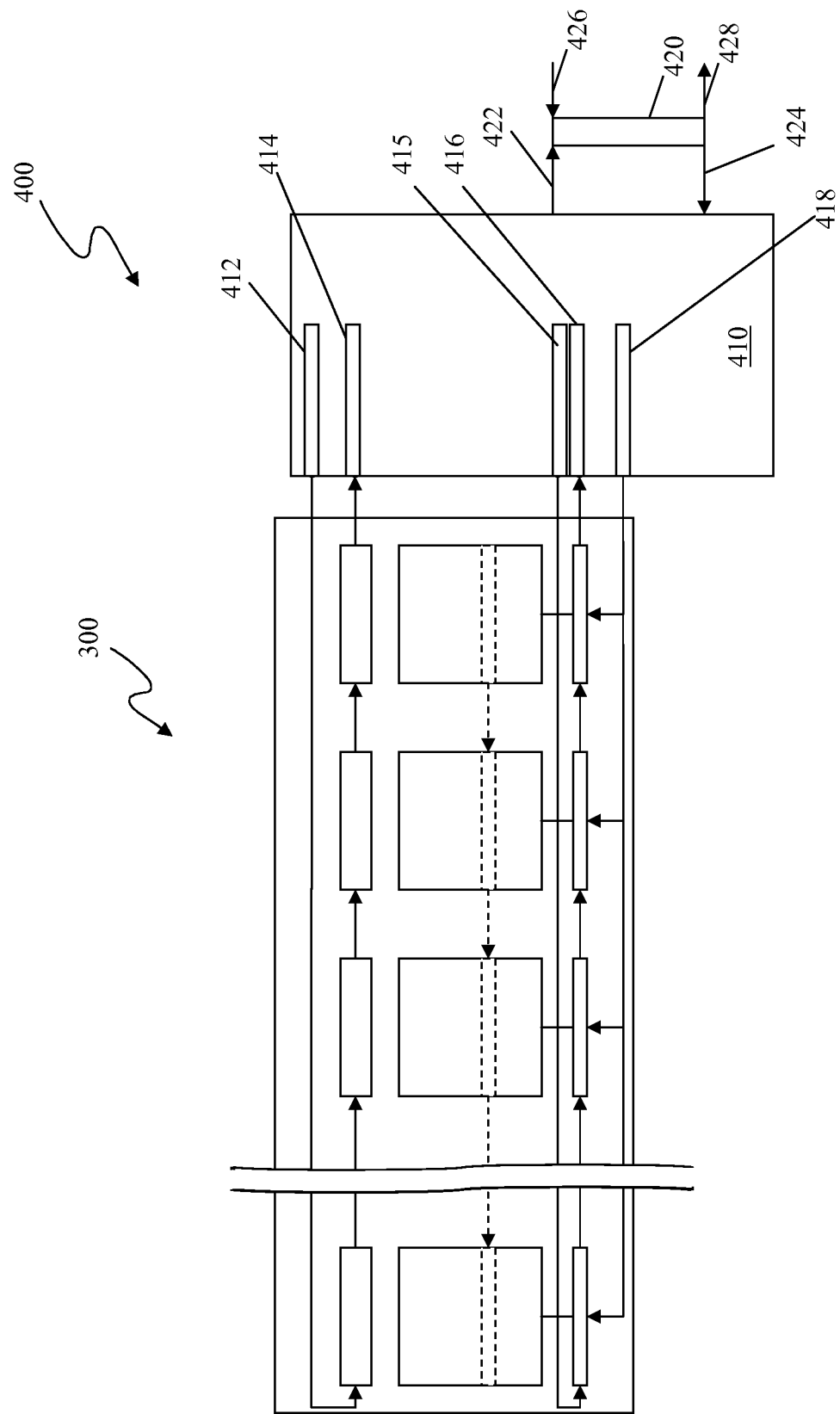
FIG. 4 is a schematic diagram of a fusebay system according to an embodiment of the invention disclosed herein.

According to embodiments, a fusebay 200, 300 may be employed in a fusebay system, such as the example fusebay system 400 shown in FIG. 4. Fusebay system 400 may include a fusebay controller 410 with a programming connector 412 connected to input 302 of a fusebay 300. Fusebay controller 410 may also include a fuse data read connector 414 connected to fusebay output 304. In embodiments, an enable latch programming connector 415 may be connected to fusebay enable input 351, and an enable latch return connector 416 may be connected to fusebay enable output 353. A control connector 418 of fusebay controller 410 may be connected to control node 306 of fusebay 300, which allows broadcast of control signals to fuse macros of fusebay 300.

Fusebay controller 410 may also be connected to a repair register 420 with a first repair register input 422 and a first repair register output 424. In embodiments, first repair register input and/or output 422, 424 may be connected to a device other than fusebay 300 in some modes of operation of fusebay system 400. In other embodiments, repair register 420 may have a second repair register input 426 and/or a second repair register output 428 to enable connection with another device.

During a programming mode of fusebay system 410, repair register 420 may provide repair data to fusebay controller 410 for storage in fusebay 300. Thus, an input 422, 426 of repair register 420 may receive data from another source, such as a tester device (not shown), which data fusebay controller 410 may transfer to fusebay data register 370 via input 302. When the data is transferred, fusebay controller 410 may send a fuseblow command via control connector 418. In embodiments, a fuseblow command may include an enable command that activates a fuse macro in which a fuse to be blown is located, as well as a location of a fuse to be blown within that fuse macro. In embodiments, fusebay controller 410 may compress repair data before sending it to fusebay data register 370 to reduce a number of fuses required to store the repair data. When a repair pass is complete, that is, when repair register 420 provides no additional data to the FUSECNTL 410 and/or receives a pass complete signal or the like, a register may be advanced so that a number of passes is known. Using the number of passes and a repair register or fusebay data register length, a last location used may be determined so that repair data from a subsequent repair pass may begin at the end of repair data from a preceding repair pass. Repair data from repair passes thus may be stacked or arranged serially, allowing great flexibility in space available for repair data from each repair pass. Additionally, a number of latches required to store data in fusebay 300 is reduced. For example, where a current 64×64 fuse array may require as many as 8192 latches, embodiments of the invention disclosed herein require as few as 65 latches—64 for the page data and 1 for the enable latch.

As should be clear to one of skill in the art, any suitable method and/or system for transferring and storing data from repair register 420 to a connected fusebay may be employed within the scope of embodiments, though advantages may be gained from using that disclosed in U.S. patent application Ser. No. 13/204,929, which is hereby incorporated by reference. Similarly, any suitable addressing scheme may be employed within the scope of embodiments, though advantages may be gained from using that disclosed in U.S. patent application Ser. No. 13/192,051, which is hereby incorporated by reference. Further, it should be clear that any suitable compression algorithm may be used to compress repair data for storage, and that a compression may simply be omitted or not employed within the scope of embodiments.

Figure 5:
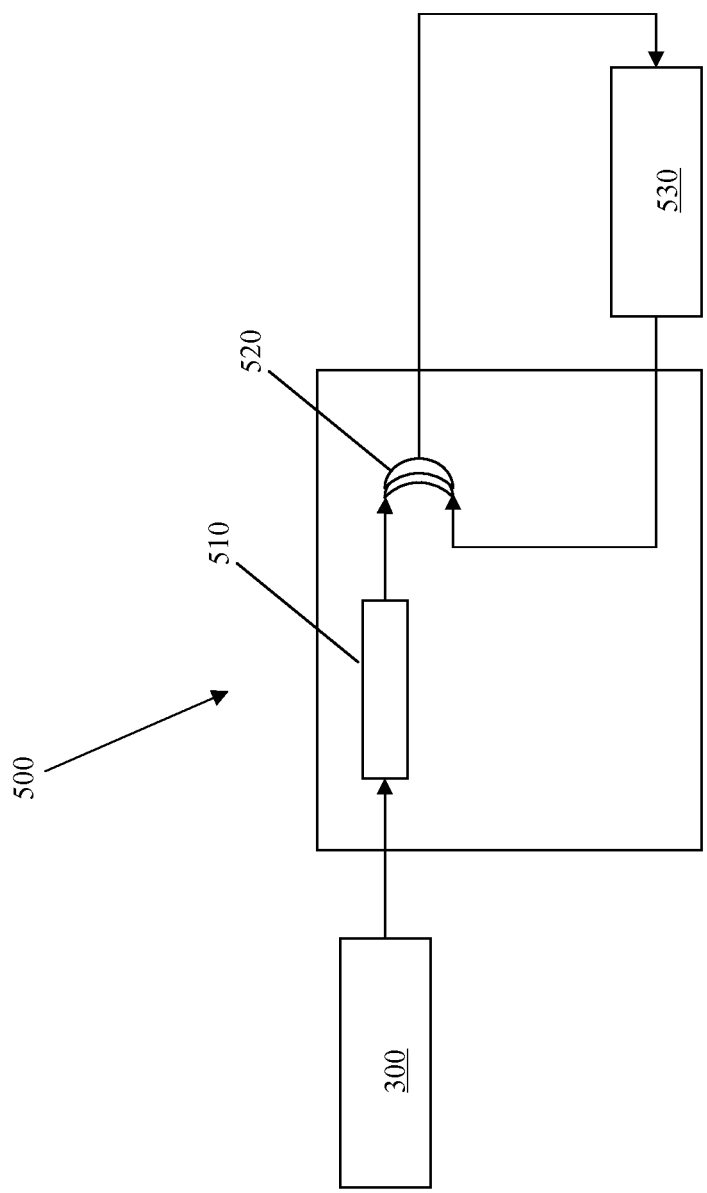
FIG. 5 is a schematic diagram illustrating a reading mode of a fusebay system according to an embodiment of the invention disclosed herein.

With reference to FIG. 5, embodiments of the invention disclosed herein may include a fusebay controller 500 that may read data from a fusebay, such as fusebay 300, and reconstruct repair data from data stored in the fusebay. For example, fusebay controller 500 may include a decompressor 510 that receives raw data from fusebay 300 and sends it to a comparator 520, such as an XOR comparator. At the same time, data from a repair register 530 connected to fusebay controller is sent to comparator 520. An initial set of zeroes in repair register 530 may be used during processing of an initial pass of repair data. Once the first pass is done, the first bit of the first pass is at the output of repair register 530 and may be compared with the first bit of the second pass, and so on until all repair passes have been read from fusebay 300 and the repair data has been reconstructed.

Figure 6:
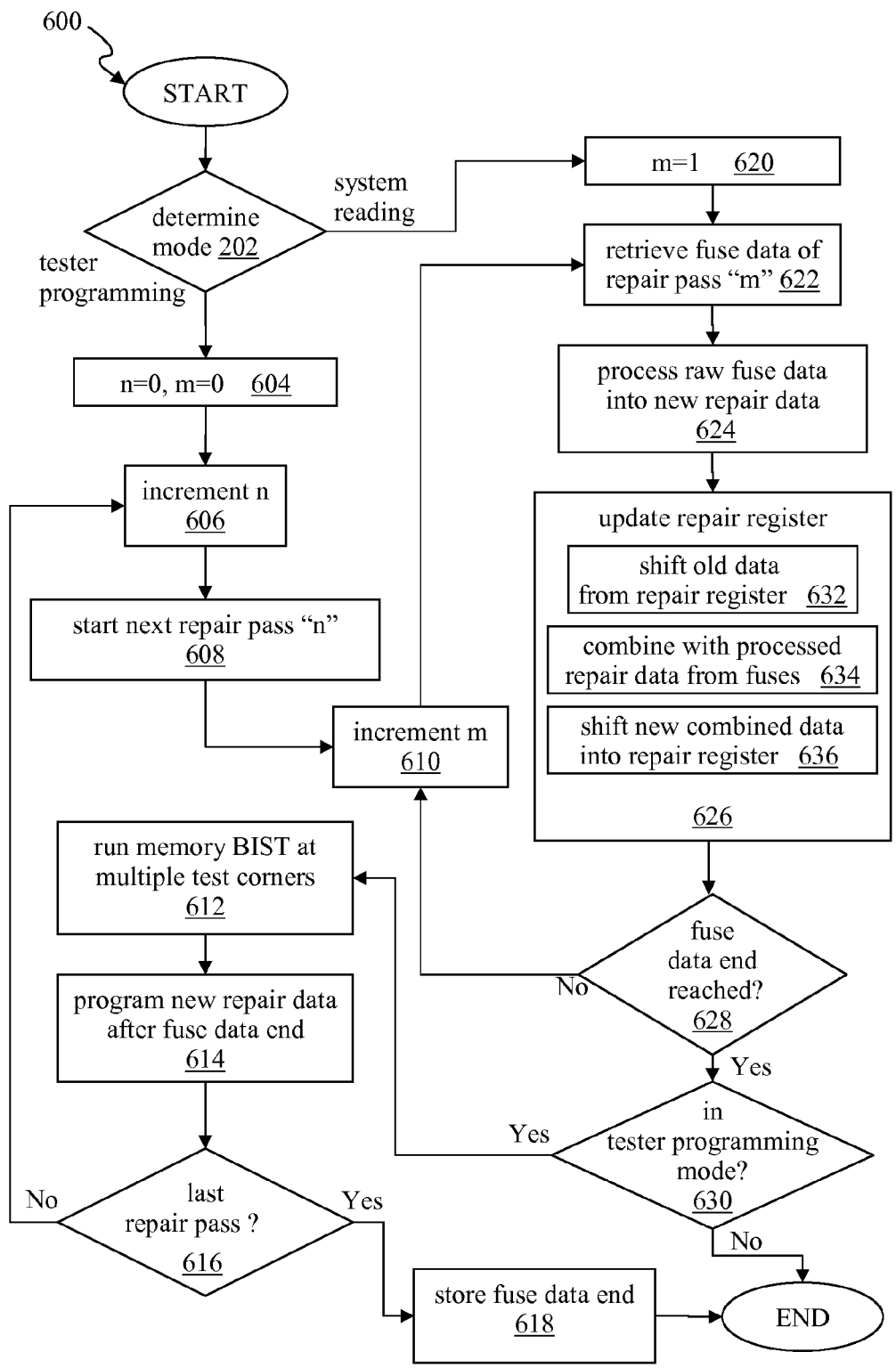
FIG. 6 is a schematic flow diagram of a method of storing compressed repair data in a fusebay according to another embodiment of the invention disclosed herein.

As seen in FIG. 6, an example of a method of using a fusebay 600 according to embodiments starts by determining what mode is used (block 602). If the mode is a test mode or a programming mode (block 604), then a next pass may be started and a pass counter may be advanced (for pass "n+1", block 606), and a next available fuse may be determined (block 608). For example, a number of fuses used may be determined by retrieving data from the fusebay into the repair register (block 622) one pass at a time (block 610), used fuses being counted during retrieval (block 628), until all stored passes and all used fuses have been counted (block 628). Data to be stored may be received (block 612) and stored starting at the next unused/available fuse (block 614), such as by programming the received data into fuses of the fusebay. A check may be made to see if the pass was the last pass (decision block 616). If not, blocks 606-610, 622-630, and 612-616 may be repeated until data from the last pass is stored. If the pass was the last pass (decision block 616), then an indication of the next available or the last used fuse may be stored (block 618), such as by storing the new pass count, and the method may end.

If the mode determination (block 602) yields reading mode (block 620), data may be retrieved from the fusebay (block 622), and a pass counter may be advanced. In embodiments, the retrieved data may be processed (block 624), but whether retrieved or processed, data may then be sent to the repair register (block 626). For example, old data in the repair register may be shifted (block 632), combined with the new/retrieved data (block 634), and the combined data may be shifted into the repair register (block 636). A check may be made as to whether the next unused/available fuse has been reached (decision block 628). If not, then blocks 610 and 622-628 may be repeated. If the next unused/available fuse location has been reached, then, if the system reading mode is active (decision block 630), the method may end or stop.

Figure 7:
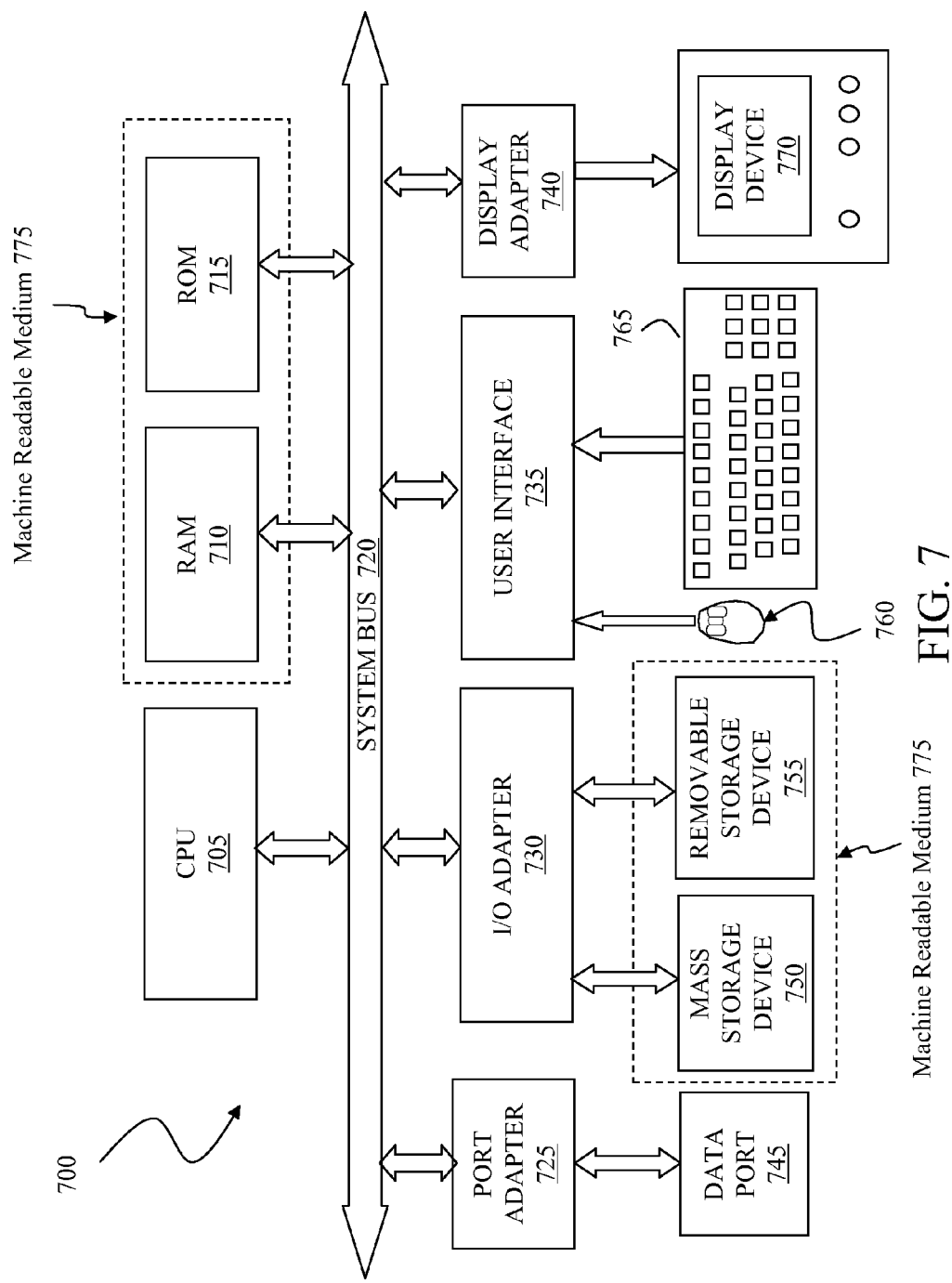
FIG. 7 is a block diagram of a general purpose computer system which may be used to practice the invention.

FIG. 7 illustrates a block diagram of a general-purpose computer system which can be used to implement the circuit and circuit design structure described herein. The design structure may be coded as a set of instructions on removable or hard media for use by general-purpose computer. FIG. 7 is a schematic block diagram of a general-purpose computer for practicing the present invention. FIG. 7 shows a computer system 700, which has at least one microprocessor or central processing unit (CPU) 705. CPU 705 is interconnected via a system bus 720 to machine readable media 775, which includes, for example, a random access memory (RAM) 710, a read-only memory (ROM) 715, a removable and/or program storage device 755 and a mass data and/or program storage device 750. An input/output (I/O) adapter 730 connects mass storage device 750 and removable storage device 755 to system bus 720. A user interface 735 connects a keyboard 765 and a mouse 760 to system bus 720, and a port adapter 725 connects a data port 745 to system bus 720 and a display adapter 740 connect a display device 770. ROM 715 contains the basic operating system for computer system 700. Examples of removable data and/or program storage device 755 include magnetic media such as floppy drives, tape drives, portable flash drives, zip drives, and optical media such as CD ROM or DVD drives. Examples of mass data and/or program storage device 750 include hard disk drives and non-volatile memory such as flash memory. In addition to keyboard 765 and mouse 760, other user input devices such as trackballs, writing tablets, pressure pads, microphones, light pens and position-sensing screen displays may be connected to user interface 735. Examples of display device 770 include cathode-ray tubes (CRT) and liquid crystal displays (LCD).

A machine readable computer program may be created by one of skill in the art and stored in computer system 700 or a data and/or any one or more of machine readable medium 775 to simplify the practicing of this invention. In operation, information for the computer program created to run the present invention is loaded on the appropriate removable data and/or program storage device 755, fed through data port 745 or entered using keyboard 765. A user controls the program by manipulating functions performed by the computer program and providing other data inputs via any of the above mentioned data input means. Display device 770 provides a means for the user to accurately control the computer program and perform the desired tasks described herein.

Figure 8:
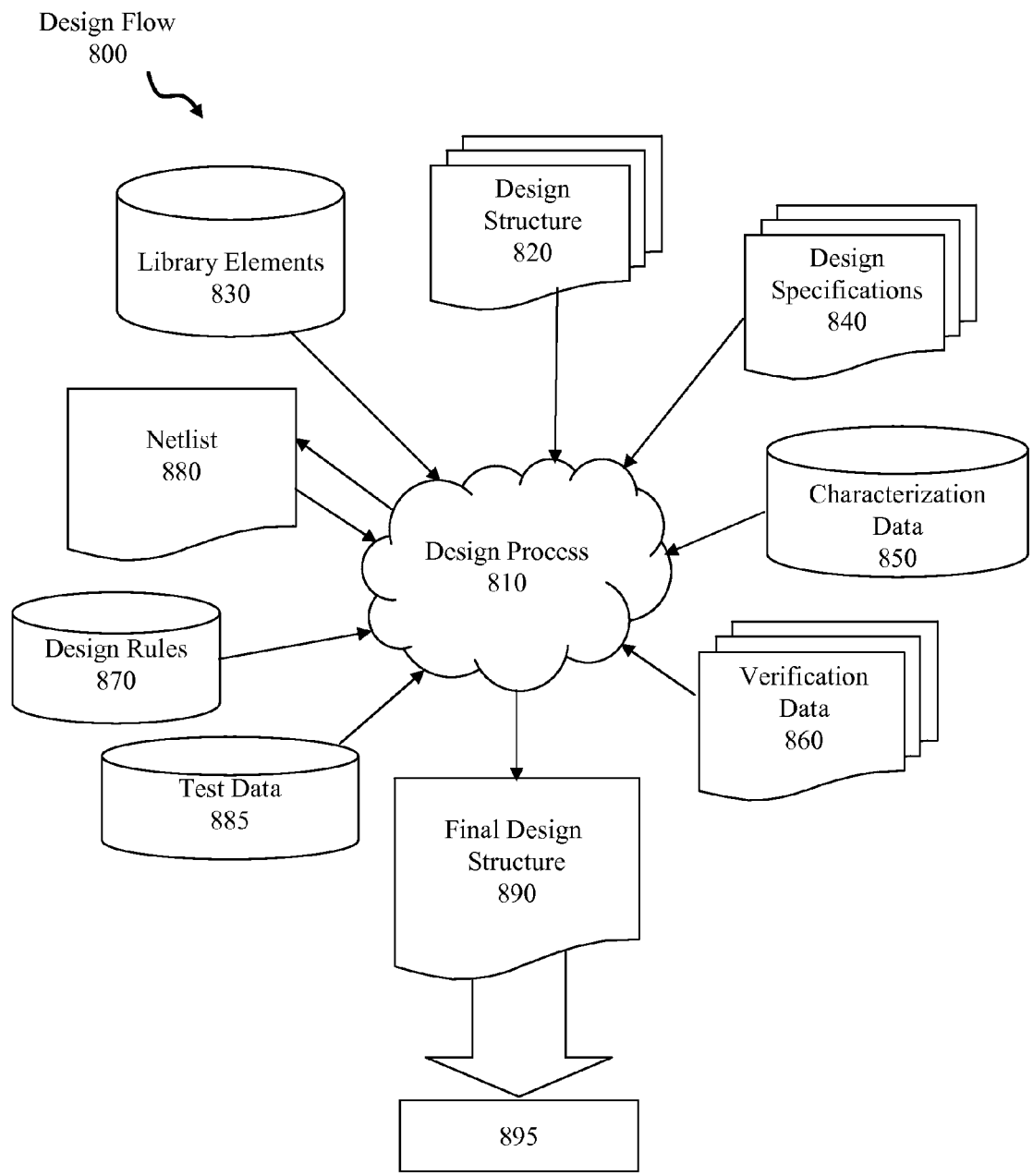
FIG. 8 is a flow diagram of a design process used in semiconductor design, manufacturing, and/or test.

FIG. 8 shows a block diagram of an example design flow 800. Design flow 800 may vary depending on the type of IC being designed. For example, a design flow 800 for building an application specific IC (ASIC) may differ from a design flow 800 for designing a standard component. Design structure 820 is preferably an input to a design process 810 and may come from an IP provider, a core developer, or other design company or may be generated by the operator of the design flow, or from other sources. Design structure 820 comprises circuit or fusebay 200 in the form of schematics or HDL, a hardware-description language (e.g., Verilog, VHDL, C, etc.). Design structure 820 may be contained on one or more machine readable medium. For example, design structure 820 may be a text file or a graphical representation of circuit or fusebay 200. Design process 810 preferably synthesizes (or translates) circuit or fusebay 200 into a netlist 880, where netlist 880 is, for example, a list of wires, transistors, logic gates, control circuits, I/O, models, etc. that describes the connections to other elements and circuits in an integrated circuit design and recorded on at least one of machine readable medium. This may be an iterative process in which netlist 880 is resynthesized one or more times depending on design specifications and parameters for the circuit.

Design process 810 may include using a variety of inputs; for example, inputs from library elements 830 which may house a set of commonly used elements, circuits, and devices, including models, layouts, and symbolic representations, for a given manufacturing technology (e.g., different technology nodes, 32 nm, 45 nm, 80 nm, etc.), design specifications 840, characterization data 850, verification data 860, design rules 870, and test data files 885 (which may include test patterns and other testing information). Design process 810 may further include, for example, standard circuit design processes such as timing analysis, verification, design rule checking, place and route operations, etc. One of ordinary skill in the art of integrated circuit design can appreciate the extent of possible electronic design automation tools and applications used in design process 810 without deviating from the scope and spirit of the invention. The design structure of the invention is not limited to any specific design flow.

Ultimately, design process 810 preferably translates circuit or fusebay 200, 300, along with the rest of the integrated circuit design (if applicable), into a final design structure 890 (e.g., information stored in a GDS storage medium). Final design structure 890 may comprise information such as, for example, test data files, design content files, manufacturing data, layout parameters, wires, levels of metal, vias, shapes, test data, data for routing through the manufacturing line, and any other data required by a semiconductor manufacturer to produce circuit or fusebay 200, 300. Final design structure 880 may then proceed to a stage 885 where, for example, final design structure 880 proceeds to tape-out, is released to manufacturing, is sent to another design house or is sent back to the customer.

The corresponding structures, materials, acts, and equivalents of any means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Further, the flow diagrams depicted herein are just an example. There may be many variations to this diagram or the steps (or operations) described therein without departing from the spirit of the invention. For instance, the steps may be performed in a differing order or steps may be added, deleted or modified. All of these variations are considered a part of the claimed invention.

What is claimed is:

1. A fusebay structure comprising:
   a first fuse macro including a first data register, a first enable latch, and a first array of fuses arranged in a first predefined number of fuse macro pages, each of the first fuse macro pages having a first fuse macro page length;
   a second fuse macro including a second data register, a second enable latch, and a second array of fuses arranged in the first predefined number of fuse macro pages, each of the second fuse macro pages having a second fuse macro page length, the second data register being connected serially with the first data register, and the second enable latch being connected serially with the first enable latch;
   a number of fusebay pages equal to the first predefined number of fuse macro pages, each fusebay page comprising a corresponding first fuse macro page aggregated with a corresponding second fuse macro page; and
   a fusebay page length equal to a sum of the first fuse macro page length and the second fuse macro page length, a fuse location being determined with a fusebay page number and a position along a respective fusebay page length.

2. The fusebay of claim 1, further comprising additional fuse macros each including a respective data register, a respective enable latch, and a respective array of fuses each with a respective page length and the first predefined number of pages, each fusebay page being an aggregate of a corresponding page from each fuse macro, the fusebay page length being equal to a sum of respective corresponding fuse macro page lengths for a respective fusebay page.

3. The fusebay of claim 2, wherein the data registers are serially connected.

4. The fusebay of claim 3, wherein only one fuse macro may be active at a time.

5. The fusebay of claim 1, wherein each fuse macro blows a fuse corresponding to a one value in data received by a respective data register.

6. A fusebay system comprising:
a first fuse macro including a first enable latch, a first data register and first array of fuses arranged in a first predefined number of pages each having a first fuse macro page length;
a fusebay control device configured to communicate with the first fuse macro employing the first predefined number of pages as a number of fusebay pages and the first fuse macro page length as a fusebay page length;
a first repair register of a first register length, the repair register being connected to the fusebay control device and configured to receive data from and send data to the fusebay control device; and
the fusebay control device being configured to issue a fuseblow command to the first data register when the first repair register is full, the fuseblow command including an address of a fuse to be blown, the address indicating a fuse location using a respective fusebay page number and a respective position along the respective fusebay page length.

7. The fusebay of claim 6, further comprising additional fuse macros each including a respective enable latch, a respective data register and a respective array of fuses.

8. The fusebay of claim 7, wherein each array of fuses is arranged with the first predefined number of pages and a respective fuse macro page length so that a fusebay page length is equal to a sum of the fuse macro page lengths.

9. The fusebay of claim 7, wherein the data registers are serially connected.

10. The fusebay of claim 9, wherein the fusebay control device is connected to the first data register at an end of the serially connected data registers and is configured to activate one fuse macro at a time with the enable latches.

11. The fusebay of claim 6, wherein, responsive to completion of a repair pass, the fusebay control device is configured to record an indication of a last position within the fusebay reached at completion of the repair pass.

12. The fusebay of claim 11, wherein the fusebay control device records a number of passes stored.

13. The fusebay of claim 11, wherein the indication of a last position is stored in the fusebay as part of a final fuseblow command.

14. A method of storing data in a fusebay structure of a fusebay system, the fusebay including at least two fuse macros having an identical number of pages, each fuse macro having a respective fuse macro page length and including a respective data register, a respective enable latch, and a respective fuse array, a fusebay page length equaling a sum of the fuse macro page lengths, a number of fusebay pages equaling the number of fuse macro pages, the fusebay system including a control device connected to the fusebay and to a repair register, the control device executing the method comprising:
in one of a test mode or a programming mode:
starting a next pass and advancing a pass counter, the next pass becoming a current pass;
determining a next available fuse location;
receiving data to be stored;
storing the received data beginning with the next available fuse;
determining whether the current pass was the last pass;
responsive to the current pass being the last pass, storing an indication of one of the next available fuse or the last used fuse;
responsive to the current pass not being the last pass, repeating the starting of a next pass, the determining of a next available fuse location, the receiving of data to be stored, the storing of the received data, and the determining whether the current pass is a last pass;
in a reading mode:
retrieving data from a fusebay and advancing a pass counter;
sending the retrieved data to a repair register;
checking whether a next available fuse has been reached;
responsive to the next available fuse being reached, stopping the method; and
responsive to the next available fuse not being reached, repeating the retrieving of data, the sending of the retrieved data, and the checking whether a next available fuse has been reached.

15. The method of claim 14, wherein the determining of a next available fuse location comprises retrieving data from the fusebay into the repair register, advancing a pass counter, and counting used fuses, until all stored passes and all used fuses have been counted.

16. The method of claim 15, wherein, in the reading mode, the retrieved data is processed before it is sent to the repair register.

17. The method of claim 16, wherein, in the reading mode, the retrieved data is processed by decompressing the retrieved data.

18. The method of claim 14, wherein, in the reading mode, sending the retrieved data to a repair register comprises shifting old data in the repair register, combining the old data with the retrieved data, and shifting the combined data into the repair register.

19. The method of claim 14, wherein, in the reading mode, the combining of the old data with the retrieved data includes using an XOR gate.

20. The method of claim 14, wherein, in the programming mode, the storing of data to be stored includes compressing the data to be stored.

* * * * *